(12) United States Patent
Zhang

(10) Patent No.: US 11,244,964 B2
(45) Date of Patent: Feb. 8, 2022

(54) DISPLAY DEVICE, ARRAY SUBSTRATE AND MANUFACTURING METHOD THEREOF

(71) Applicant: BOE TECHNOLOGY GROUP CO., LTD., Beijing (CN)

(72) Inventor: Shuai Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 596 days.

(21) Appl. No.: 16/097,938

(22) PCT Filed: Jan. 29, 2018

(86) PCT No.: PCT/CN2018/074397
§ 371 (c)(1),
(2) Date: Oct. 31, 2018

(87) PCT Pub. No.: WO2019/019584
PCT Pub. Date: Jan. 31, 2019

(65) Prior Publication Data
US 2021/0225892 A1 Jul. 22, 2021

(30) Foreign Application Priority Data

Jul. 24, 2017 (CN) .......................... 201710607262.8

(51) Int. Cl.
*H01L 27/00* (2006.01)
*H01L 27/12* (2006.01)
(52) U.S. Cl.
CPC ...... *H01L 27/1237* (2013.01); *H01L 27/1225* (2013.01); *H01L 27/1262* (2013.01)
(58) Field of Classification Search
CPC ............. H01L 27/1237; H01L 27/1225; H01L 27/1262; B82Y 30/00; B82Y 99/00
See application file for complete search history.

(56) References Cited

U.S. PATENT DOCUMENTS 8,053,773 B2   11/2011   Shin et al.
8,871,566 B2   10/2014   Shin et al.
(Continued)

FOREIGN PATENT DOCUMENTS

CN   104377306 A   2/2015
CN   104716047 A   6/2015
(Continued)

OTHER PUBLICATIONS

Search Report and Written Opinion for International Application No. PCT/CN2018/074397 dated Apr. 27, 2018.
(Continued)

*Primary Examiner* — Nikolay K Yushin
(74) *Attorney, Agent, or Firm* — Calfee, Halter & Griswold LLP

(57) ABSTRACT

The present disclosure relates to a display device, an array substrate and a manufacturing method thereof, and relates to the technical field of display. The method includes steps of: providing a base substrate, and forming a semiconductor pattern, a gate insulation layer, a gate electrode, an insulation layer and a source/drain electrode on the base substrate, and further includes forming the composite material layer on the base substrate including the semiconductor pattern, and hydrotreating the composite material layer, in which the composite material layer may contain titanium complex-graphene oxide. The present disclosure is capable of omitting the interlayer insulation layer, thereby avoiding the situation that a flexible layer cannot be displayed due to the breakage of insulation layer between inorganic layers, thereby improving bending performance of the flexible screen.

10 Claims, 5 Drawing Sheets

(56) References Cited

U.S. PATENT DOCUMENTS

| | | |
|---|---|---|
| 2008/0303020 A1 | 12/2008 | Shin et al. |
| 2012/0052636 A1 | 3/2012 | Shin et al. |
| 2017/0365623 A1 | 12/2017 | Zhang et al. |

FOREIGN PATENT DOCUMENTS

| | | | | |
|---|---|---|---|---|
| CN | 105261654 A | | 1/2016 | |
| CN | 105590756 | * | 5/2016 | ............ B82Y 30/00 |
| CN | 107170830 A | | 9/2017 | |
| CN | 107342298 A | | 11/2017 | |
| WO | 2017073097 A1 | | 5/2017 | |

OTHER PUBLICATIONS

First Office Action for Chinese Patent Application No. 201710607262.8 dated Jun. 25, 2019.

Huang Zirong et al., "Synthesis, Activation, Characterization and Properties of Titanium Complexes/Graphine Oxide Composite Materials," Guangdong Chemical Industry, 2015 ( )—5 pages.

* cited by examiner

DISPLAY DEVICE, ARRAY SUBSTRATE AND MANUFACTURING METHOD THEREOF

CROSS-REFERENCE TO RELATED APPLICATIONS

The present application is the U.S. national phase entry of PCT/CN2018/074397, with an international filing date of Jan. 29, 2018, which is based on and claims priority to Chinese Patent Application No. 201710607262.8, filed on Jul. 24, 2017, the entire contents thereof are incorporated herein by reference.

TECHNICAL FIELD

The present disclosure relates to the field of display technology, in particular to a display device, an array substrate and a manufacturing method of the array substrate.

BACKGROUND

Traditional displays are flat displays that cannot be bent. A future trend in the field of display technology is intended to display on a flexible display that can be bent, i.e. to achieve a flexible display.

The existing array substrate for achieving a flexible display generally applies a low temperature polysilicon (abbreviated as LTPS) thin film transistor array substrate. In the manufacturing process of the LTPS thin film transistor array substrate in related art, there are several defects and dislocations between crystalline grains of polysilicon and dangling bonds caused by lattice mismatch, which leads to a large number of defect modes in the polysilicon, reduces carrier mobility and affects performance of the devices, so it is necessary to provide an inter layer dielectric (abbreviated as ILD) with rich hydrogen to compensate these defect modes. Since the ILD is mostly deposited by both silicon oxide (SiOx) and silicon nitride (SiNx). Both the SiOx layer and the SiNx layer after hydrotreated are rich in hydrogen atoms, which are transmitted towards the polysilicon layer by heat treatment, thereby compensate defect modes presented in the polysilicon. However, as ILD is made of inorganic material generally with a thickness of about 500 nm, concentration of the bending stress of the ILD is too high in the bending process of the flexible screen, which may make the ILD fractured and thus may make the source/drain metal broken, so that the flexible screen cannot display.

It should be noted that the information disclosed in the above background is only intended to better understand the background of the present disclosure, and thus may include information that does not constitute prior art known to those of ordinary skill in the art.

SUMMARY

An object of the present disclosure is to provide a display device, an array substrate and a manufacturing method of the array substrate.

According to an aspect of the present disclosure, a manufacturing method of an array substrate is provided, which includes steps of providing a base substrate and forming a semiconductor pattern, a gate insulation layer, a gate electrode, an insulation layer and a source/drain electrode on the base substrate; the manufacturing method of the array substrate further includes:

forming a composite material layer on the base substrate including the semiconductor pattern, and hydrotreating the composite material layer, in which the composite material layer may contain titanium complex-graphene oxide.

In an exemplary embodiment of the present disclosure, the semiconductor pattern may contain polysilicon.

In an exemplary embodiment of the present disclosure, forming the composite material layer on the base substrate including the semiconductor pattern may include:

forming the composite material layer on the base substrate including the semiconductor pattern by spin coating.

In an exemplary embodiment of the present disclosure, the composite material layer may contain $H_8F_6N_2Ti$-FGO.

In an exemplary embodiment of the present disclosure, a process of manufacturing the $H_8F_6N_2Ti$-FGO may include:

preparing graphene oxide by oxidation reaction using flake graphite as a raw material, and preparing graphene oxide ethanol solution based on the graphene oxide;

adding carbamide into the graphene oxide ethanol solution to obtain carbamide-graphene oxide solution;

adding ionized water in which polyethylene glycol and ammonium fluorotitanate are dissolved into the carbamide-graphene oxide solution, and then performing post-treatment to obtain the $H_8F_6N_2Ti$-FGO.

According to an aspect of the present disclosure, an array substrate is provided, which may include a base substrate, a semiconductor pattern, a gate insulation layer, a gate electrode, an insulation layer and a source/drain electrode, the array substrate may further include:

a composite material layer at least covering the semiconductor pattern, wherein the composite material layer may contain titanium complex-graphene oxide containing hydrogen atoms.

In an exemplary embodiment of the present disclosure, the semiconductor pattern may contain polysilicon.

In an exemplary embodiment of the present disclosure, the array substrate may further include:

a buffer layer disposed between the base substrate and the semiconductor pattern.

In an exemplary embodiment of the present disclosure, the composite material layer containing hydrogen atoms contains $H_8F_6N_2Ti$-FGO According to an aspect of the present disclosure, a display device is provided, which may include the array substrate according to any of the above embodiments.

It should be understood that the above general description and the following detailed description are intended to be illustrative, and not restrictive of the present disclosure.

This section provides an overview of various implementations or examples of various techniques described in the present disclosure, which are not the whole scope of techniques described or the comprehensive disclosure of all features.

BRIEF DESCRIPTION OF THE DRAWINGS

The accompanying drawings, which are incorporated in the specification and constitute part of the present specification, show embodiments in accordance with the present disclosure, and explain principle of the present disclosure together with this specification. It is obvious for those ordinary skilled in the art that the accompanying drawings in the following description are merely some embodiments of the present disclosure, and other drawings may also be obtained by these drawings without any creative work.

REFERENCE NUMBER

Figure 1:
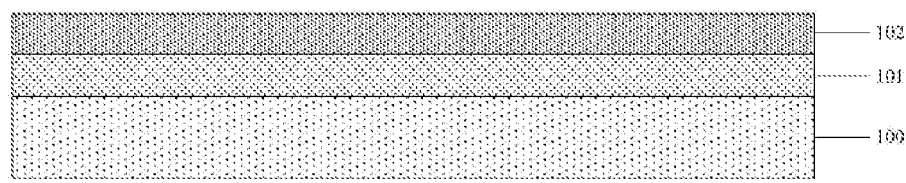
FIG. 1 schematically illustrates a schematic structural view of forming a buffer layer and a semiconductor pattern, according to an exemplary embodiment of the present disclosure.

100: base substrate; 101: buffer layer; 102: semiconductor pattern; 103: composite material layer; 104: photoresist; 110: first via hole; 120: second via hole; 200: gate insulation layer; 300: gate electrode layer; 301: gate electrode layer photoresist; 400: insulation layer; 500: source/drain electrode layer.

DETAILED DESCRIPTION

Example embodiments will now be described more fully with reference to the accompanying drawings. However, the example embodiments can be embodied in a variety of forms and should not be construed as limitation of the examples set forth herein; rather, these embodiments are provided so that the present disclosure will be more comprehensive and complete, and ideas of the example embodiments will be roundly given to those skilled in the art. The described features, structures, or characteristics may be combined in one or more embodiments in any suitable manner. In the following description, numerous specific details are set forth to make full sense of the embodiments of the present disclose. However, one skilled in the art will appreciate that technical solutions of the present disclosure can be implemented with one or more of the specific details omitted, or other methods, components, devices, steps and the like may be employed. In other situations, well-known technical solutions are not shown or described in detail to avoid obscuring aspects of the disclosure.

In addition, drawings are merely schematic representations of the present disclosure and are not necessarily to scale. The same reference numbers in the drawings denote the same or similar parts, and the repeated description thereof will be omitted. Some of the block diagrams shown in the figures are functional entities and do not necessarily have to correspond to physically or logically separate entities. These functional entities may be implemented in software, or implemented in one or more hardware modules or integrated circuits, or implemented in different network and/or processor devices and/or microcontroller devices.

In the present exemplary embodiment, a manufacturing method of an array substrate is firstly provided. The manufacturing method of the array substrate may include steps of providing a base substrate, and forming a semiconductor pattern, a gate insulation layer, a gate electrode, an insulation layer and a source/drain electrode on the base substrate, and may further include a step of forming a composite material layer on the base substrate including the semiconductor pattern and then hydrotreating the composite material layer, the composite material layer including titanium complex-graphene oxide.

According to the manufacturing method of the array substrate of the present exemplary embodiment, on the one hand, the composite material layer including titanium complex-graphene oxide is formed on the semiconductor pattern and then hydrotreated. Due to the titanium complex-graphite oxide has strong hydrogen storage capability, such that a defect mode of the semiconductor pattern may be compensated by hydrogen atoms stored in the titanium complex-graphene oxide, thusly omitting an insulation layer between inorganic layers; on the other hand, the composite material layer is an organic film layer having better flexibility, and may avoid the situation that a flexible layer cannot be displayed due to the breakage of insulation layer between inorganic layers, thereby improving bending performance of the flexible screen.

In the present disclosure, the term "titanium complex-graphene oxide" may be considered as a composite material including titanium complex and graphene oxide, unless otherwise specified. However, it should be understood that the composite material layer is not limited to only contain the above two components, but may contain other components such as a thickener, a binder, a modifier, a stabilizer and a basement material in addition to the above two components.

Next, the manufacturing method of the array substrate in the present exemplary embodiment will be described in detail with reference to the accompanying drawings.

Referring to FIG. 1, in the present exemplary embodiment, the base substrate 100 is composed of a transparent material such as glass. First, the base substrate 100 may be cleaned, and then a buffer layer 101 and a semiconductor pattern 102 are formed on the base substrate 100 by a plasma enhanced chemical vapor deposition (PECVD) method; or the semiconductor pattern 102 is formed on the base substrate 100 by the PECVD method.

The buffer layer 101 may be composed of a silicon oxide layer, a silicon nitride layer or a composite material layer containing a silicon oxide layer and a silicon nitride layer, wherein the silicon oxide layer may have a thickness of 50 nm to 100 nm, and the silicon nitride layer may have a thickness of 100 nm to 300 nm. When the step of forming the semiconductor pattern 102 includes a step of laser activating, the used laser light generates a large amount of heat, and the buffer layer 101 is provided to absorb the heat generated by the laser light, thereby avoiding an adverse effect of laser heat release on the base substrate 100.

Further, in the present exemplary embodiment, the semiconductor pattern 102 contains polysilicon which is formed by recrystallization of an amorphous silicon thin film. Since the amorphous silicon thin film deposited by the PECVD method usually contains 10% to 15% of hydrogen, it is generally required to control the hydrogen content in the amorphous silicon thin film to 2%, otherwise the surface roughness and the particle size of the continuously crystallized polysilicon is affected. Therefore, forming the semiconductor pattern 102 on the base substrate 100 may include the following steps: forming the amorphous silicon thin film layer on the base substrate 100, in which the amorphous silicon thin film layer has a thickness of 40 nm to 50 nm; next, sending the base substrate 100 into a high-temperature furnace to perform high-temperature dehydrogenation treatment with the purpose of dehydrogenation (reducing the hydrogen content in the amorphous silicon thin film layer); and then excimer laser annealing the base substrate 100 including the amorphous silicon thin film layer so that the amorphous silicon thin film layer is transformed into a polysilicon film layer.

Further, in the exemplary embodiment, the polysilicon film layer may also be patterned and then ion-doped to form the semiconductor pattern 102 including a heavily doped region, a lightly doped region and a channel region. The ion-doping is neither limited to N-type doping using phosphorus ions nor P-type doping using boron ions. Therefore, the finally formed thin film transistor (TFT) in the array substrate may be an N-type TFT, or may also be a P-type TFT.

Since there are many defects and dislocations between crystal grains of polysilicon and a large number of dangling bonds caused by lattice mismatch, a large number of defect modes exist in the polysilicon, which will reduce carrier mobility and affect device performance. Therefore, in the present exemplary embodiment, the composite material layer 103 may be formed on the base substrate 100 including the semiconductor pattern 102 and may be hydrogenated. The composite material layer 103 may include titanium complex-graphene oxide. In the present exemplary embodiment, the titanium complex-graphene oxide may contain $H_8F_6N_2Ti$-FGO, i.e., ammonium fluorotitanate/graphene oxide. The $H_8F_6N_2Ti$-FGO composite material is a plane layer structure in which carbon atoms are formed into a hexagonal honeycomb lattice in a sp2 hybrid orbital and has a strong hydrogen storage capability. Therefore, after hydrogenating the composite material layer 103 containing $H_8F_6N_2Ti$-FGO, the composite material layer 103 is rich in hydrogen ions, and can compensate the defect mode in the semiconductor pattern 102, so that it is not necessary to form an interlayer insulation layer to compensate again and the interlayer insulation layer may be omitted.

In the present exemplary embodiment, the ammonium fluorotitanate/graphene oxide ($H_8F_6N_2Ti$-FGO) may be prepared in advance, and a process of preparing $H_8F_6N_2Ti$-FGO may mainly include the following steps: preparing graphene oxide by oxidation reaction using flake graphite as a raw material, and preparing a graphene oxide ethanol solution based on the graphene oxide; adding carbamide into the graphene oxide ethanol solution to obtain the carbamide-graphene oxide solution; and adding an ionized water in which polyethylene glycol and ammonium fluorotitanate are dissolved into the carbamide-graphene oxide solution which is post-treated to obtain the $H_8F_6N_2Ti$-FGO.

Specifically, in the present exemplary embodiment, the detailed preparation process of $H_8F_6N_2Ti$-FGO can be as follows: by using natural flake graphite as a raw material and using potassium permanganate and concentrated sulfuric acid as the oxidant, placing a natural flake graphite and an oxidant into a reaction solvent to carry out a reaction with the reaction time of about 1.5 hours, so that graphene oxide (GO) may be prepared; weighting graphene oxide and adding the same to anhydrous ethanol, and then sonicating the anhydrous ethanol solution with graphene oxide added for about 3 hours, so that the graphene oxide is fully dissolved to obtain a preliminary graphene oxide ethanol solution. In the graphene oxide ethanol solution, carbamide is added and heated in a water bath at a temperature of 333 K for 3 hours. After the solution is cooled, the mixed solution is sonicated for 15 minutes to obtain a carbamide-graphite oxide (FGO) dilute solution. After that, polyethylene glycol and ammonium fluorotitanate are dissolved in a deionized water and then added into the above carbamide-graphite oxide dilute solution. The mixed solution is sonicated for 15 minutes, and then transferred to an oil bath to react for 5 hours at a temperature of 423 K. It was naturally cooled to room temperature, centrifuged, washed with anhydrous ethanol and deionized water for several times, and then dried for 6 hours at 333 K to obtain an ammonium fluorotitanate/graphene oxide composite material, i.e., $H_8F_6N_2Ti$-FGO.

Figure 2:
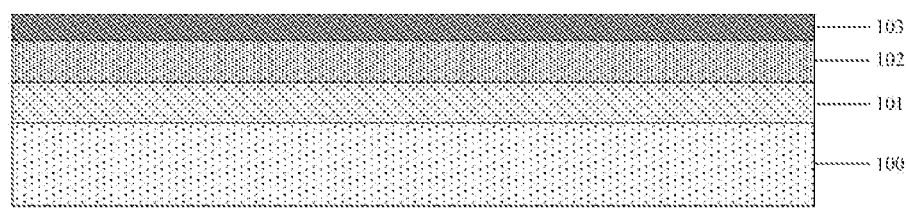
FIG. 2 schematically illustrates a schematic structural view of forming a composite material layer, according to an exemplary embodiment of the present disclosure.

Further, in the present exemplary embodiment, forming the composite material layer 103 on the base substrate including the semiconductor pattern 102 may include: by using an ethanol solution having a concentration of 10% as a solvent, and ultrasonic dispersing the ammonium fluorotitanate/graphene oxide composite material to prepare a spin-coated liquid of the ammonium fluorotitanate/graphene oxide composite material; applying the spin-coated liquid evenly onto the buffer layer 101 and/or the semiconductor pattern 102 and then drying, thereby obtaining the composite material layer 103 containing the ammonium fluorotitanate/graphene oxide, as shown in FIG. 2. In the present exemplary embodiment, the thickness of the composite material layer 103 may be controlled to about 10 nm by controlling the concentration of the spin-coated liquid. Of course, the thickness of the composite material layer 103 may also be controlled within other suitable size ranges, which is not specifically limited. Next, in the present exemplary embodiment, the composite material layer 103 containing $H_8F_6N_2Ti$-FGO may be subjected to surface treatment such as hydrogen plasma treatment, and then hydrogenated, so that the composite material layer 103 containing $H_8F_6N_2Ti$-FGO is rich in hydrogen atoms.

Figure 3:
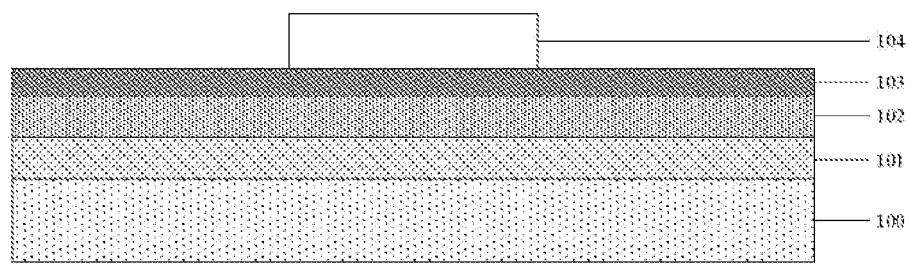
FIG. 3 schematically illustrates a schematic view after exposing and developing a buffer layer and an active layer, according to an exemplary embodiment of the present disclosure.
Figure 4:
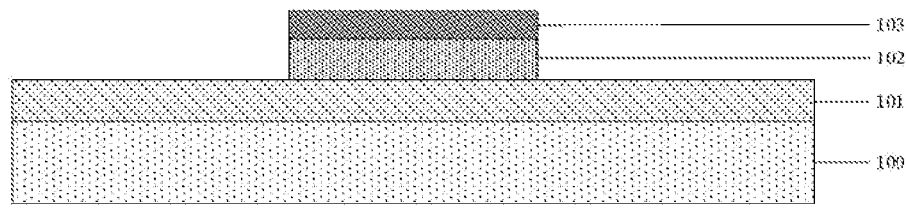
FIG. 4 schematically illustrates a schematic cross-sectional view after etching and stripping a semiconductor pattern, according to an exemplary embodiment of the present disclosure.

Referring to FIG. 3 and FIG. 4, in the present exemplary embodiment, a layer of photoresist may be coated on a region where the composite material layer 103 needs to be retained, followed by exposure and development treatment to form a photoresist pattern 104, the structure of which is shown in FIG. 3. Then, the semiconductor pattern 102 and the composite material layer 103 are etched, and the photoresist 104 is peeled off by a striper, the structure after peeled being shown in FIG. 4.

Figure 5:
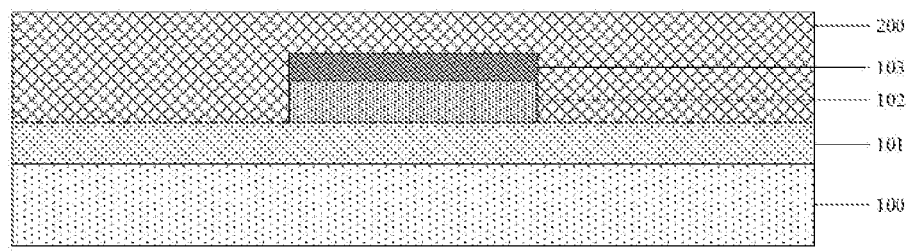
FIG. 5 schematically illustrates a schematic structural view of forming a gate insulation layer, according to an exemplary embodiment of the present disclosure.

Next, referring to FIG. 5, the gate insulation layer 200 covering the composite material layer 103 and the buffer layer 101 may be formed by PECVD method. The gate insulation layer 200 may include oxide containing silicon such as SiOx or nitride containing silicon such as SiNx, and may also include a composite of oxide containing silicon and nitride containing silicon.

Figure 6:
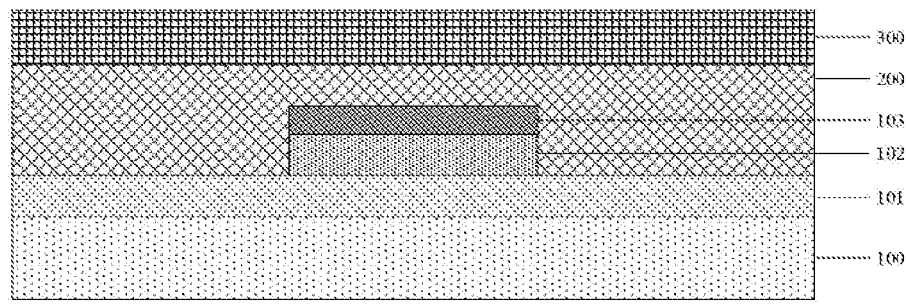
FIG. 6 schematically illustrates a schematic structural cross-sectional view of forming a gate layer, according to an exemplary embodiment of the present disclosure.
Figure 7:
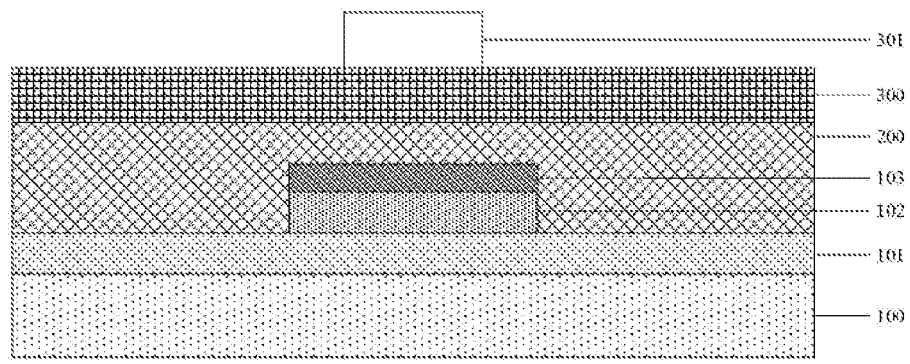
FIG. 7 schematically illustrates a schematic structural view after exposing and developing a gate layer, according to an exemplary embodiment of the present disclosure.
Figure 8:
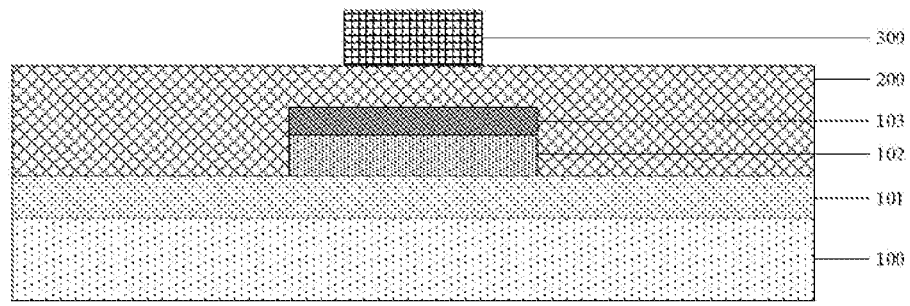
FIG. 8 schematically illustrates a schematic structural cross-sectional view after etching and stripping a gate layer, according to an exemplary embodiment of the present disclosure.

Then, referring to FIG. 6, the gate layer 300 may be formed on the gate insulation layer 200 by sputtering, thermal evaporation or other film forming method. The gate layer 300 may include materials such as chromium (Cr), molybdenum (Mo), aluminum (Al), copper (Cu), tungsten (W), niobium (Nd) and alloys thereof. In addition, the gate layer 300 may be a one-layer or a multi-layer structure. Next, a layer of photoresist may be coated on a region where the gate layer 300 needs to be retained, followed by exposure and development treatment to form a gate photoresist pattern 301, the structure of which is shown in FIG. 7. Then, the gate layer 300 are etched, and the photoresist is peeled off by a striper, the structure after peeled being shown in FIG. 8.

Figure 9:
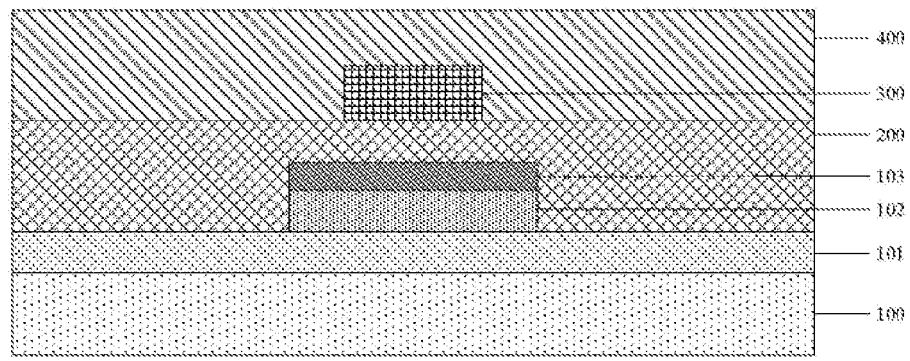
FIG. 9 schematically illustrates a schematic structural cross-sectional view of forming an insulation layer, according to an exemplary embodiment of the present disclosure; FIG.

Further, in the present exemplary embodiment, since the defect mode in the semiconductor pattern 102 may be compensated by hydrogen source in the composite material layer 103 after hydrogenation treatment of the composite material layer 103, it is not necessary to form the interlayer insulation layer in the subsequent process to compensate the defect mode in the semiconductor pattern 102. Specifically, hydrogen atoms in the composite material layer 103 may be transferred to the semiconductor pattern 102 by heat treatment after hydrogenation treatment of the composite material layer 103, so that the defect mode in the semiconductor pattern 102 is compensated, and thus it is no longer necessary to form the interlayer insulation layer in the subsequent process to compensate the defect mode in the semiconductor pattern 102. Therefore, as shown in FIG. 9, an insulation layer 400 covering the gate layer 300 and the gate insulation layer 200 may be formed. In the present example, the insulation layer 400 may be an organic material such as resin, or may be SiO2 or SiNx, which is not specifically limited in the present disclosure.

Figure 10:
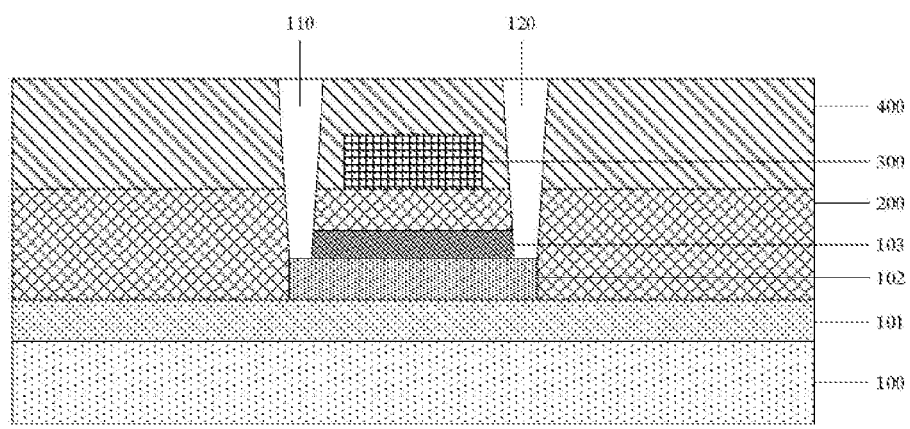
FIG. 10 schematically illustrates a schematic view after etching and stripping an insulation layer, according to an exemplary embodiment of the present disclosure.

Next, a layer of photoresist may be coated on the insulation layer 400, and then patterns of the first via hole 110 and the second via hole 120 respectively exposing surfaces of both ends of the semiconductor pattern 102 are formed by exposure, development and etching. The cross-sections of hole walls of the first via hole 110 and the second via hole 120 have a shape of smooth slope. The structure after etching and peeling off the photoresist is as shown in FIG. 10.

Figure 11:
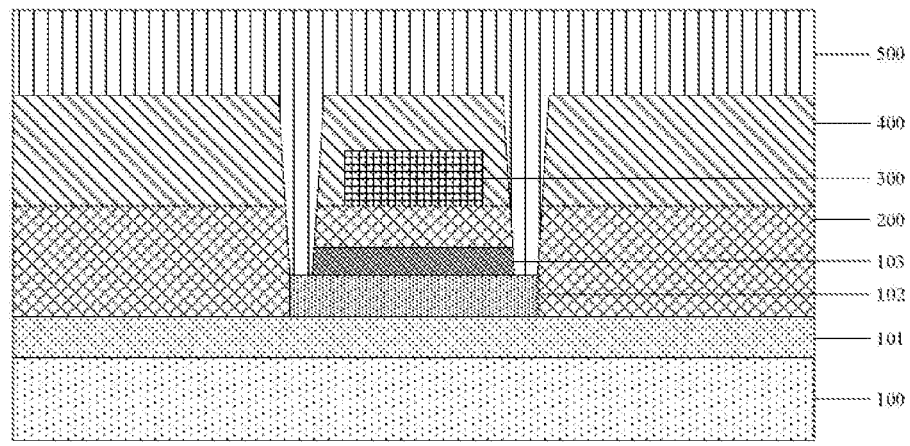
FIG. 11 schematically illustrates a schematic structural view of a structure of forming a source/drain electrode layer, according to an exemplary embodiment of the present disclosure.
Figure 12:
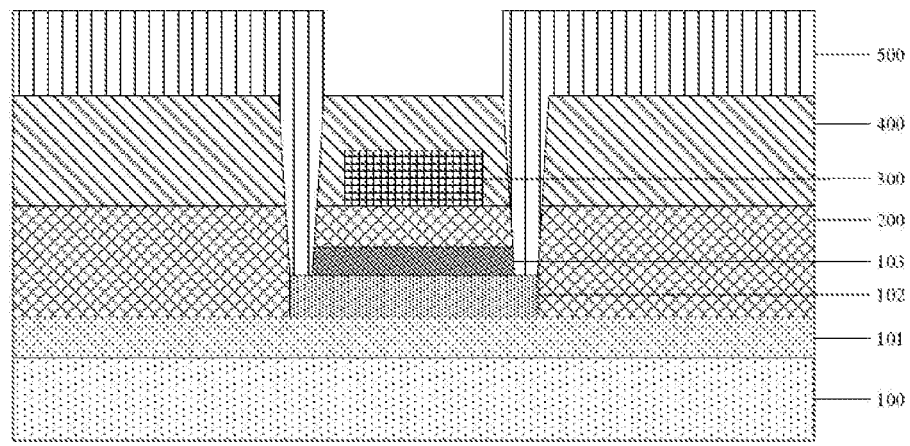
FIG. 12 schematically illustrates a schematic view after etching and stripping a source/drain electrode layer, according to an exemplary embodiment of the present disclosure.

Then, in the present exemplary embodiment, referring to FIG. 11, the source/drain layer 500 covering the insulation layer 400, the first via hole 110 and the second via hole 120 may be formed. Next, a layer of photoresist may be coated on the insulation layer 400, and then the pattern 500 of the source/drain electrode are formed by exposure, development and etching. The structure after etching and peeling off the photoresist is as shown in FIG. 12. The subsequent process of the manufacturing method of the array substrate in the present exemplary embodiment is the same as that of the conventional low temperature polysilicon (LTPS) TFT array substrate, and will not be described herein.

It should be noted that, although in the present exemplary embodiment, the manufacturing method of the array substrate is described as a process of manufacturing a top gate type low temperature polysilicon TFT array substrate, it should be understood by those skilled in the art that the manufacturing method of the array substrate in the present exemplary embodiment may be appropriately adjusted to manufacture a bottom gate type low temperature polysilicon TFT array substrate, which is also within the scope of the present disclosure.

In addition, the manufacturing method of the array substrate in the present exemplary embodiment may be applied to the array substrate for manufacturing an active matrix liquid crystal display (AMLCD), and may also be applied to the array substrate for manufacturing an active matrix organic light emitting diode (AMOLED), which is not particularly limited in the present disclosure.

Further, in the present exemplary embodiment, an array substrate is also provided. Referring to FIG. 12, the array substrate may include a base substrate 100, a semiconductor pattern 102, a gate insulation layer 200, a gate electrode 300, an insulation layer 400, and a source/drain electrode 500. The array substrate may further include: a composite material layer 103 at least covering the semiconductor pattern 102, wherein the composite material layer 103 includes titanium complex-graphene oxide containing hydrogen atoms.

According to the array substrate in the present exemplary embodiment, on the one hand, a composite material layer including titanium complex-graphene oxide is formed on a semiconductor pattern and then hydrogenated. Due to the titanium complex-graphite oxide has strong hydrogen storage capability, and a defect mode of the semiconductor pattern may be compensated by hydrogen atoms stored in the titanium complex-graphene oxide, so that an insulation layer between inorganic layers can be omitted; on the other hand, the composite material layer is an organic film layer having better flexibility, and may avoid the situation that a flexible layer cannot be displayed due to the breakage of insulation layer between inorganic layers, thereby improving bending performance of the flexible screen.

Further, in the present exemplary embodiment, the semiconductor pattern 102 includes polysilicon.

In addition, in the present exemplary embodiment, the array substrate may further include: a buffer layer 101 disposed between the base substrate 100 and the semiconductor pattern 102. The buffer layer 101 may be composed of a silicon oxide layer, a silicon nitride layer or a composite material layer containing a silicon oxide layer and a silicon nitride layer.

Further, in the present exemplary embodiment, the titanium complex-graphene oxide includes ammonium fluorotitanate/graphene oxide, i.e., $H_8F_6N_2Ti$-FGO.

In the present exemplary embodiment, the array substrate may be a top gate structure or a bottom gate structure. In the case where the array substrate is a top gate structure, the semiconductor pattern 102 is disposed on the base substrate 100; the gate insulation layer 200 is disposed on the composite material layer 103; the gate layer 300 is disposed on the gate insulation layer 200; the insulation layer 400 is disposed on the gate insulation layer 200 and covers the gate layer 300; and the source/drain layer 500 is disposed on the insulation layer 400.

In addition, in the case where the array substrate is a bottom gate structure, the gate layer 300 is disposed on the base substrate 100; the gate insulation layer 200 is disposed on the base substrate 100 and covers the gate layer 300; the semiconductor pattern 102 is disposed on the gate insulation layer 200; the insulation layer 400 is disposed on the composite material layer 103; and the source/drain layer 500 is disposed on the insulation layer 400.

In addition, in the present exemplary embodiment, there is further provided a display device including the array substrate according to the above embodiment. Since the display device in the present exemplary embodiment employs the above array substrate, it has at least all of advantages corresponding to the array substrate. In the exemplary embodiment, the display device may be: an OLED display device, a mobile phone, a tablet computer, a television, a display, a notebook computer, a digital camera, and the like, or any product or component having a display function, which is not limited in the present disclosure.

Other embodiments of the present disclosure will be apparent to those skilled in the art after considering the specification and implementing the disclosed invention. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are to be regarded as illustrative only, the true scope and spirit of the present disclosure is pointed out by the appended claims.

It should be understood that the present disclosure is not limited to the precise structures that have been described above and shown in the accompanying drawings, and various modifications and changes can be made without departing from the scope of the invention. The scope of the present disclosure is limited only by the appended claims.

What is claimed is:

1. A manufacturing method of an array substrate comprising steps of:
   providing a base substrate,
   forming a semiconductor pattern, a gate insulation layer, a gate electrode, an insulation layer and a source/drain electrode on the base substrate;
   forming a composite material layer on the base substrate comprising the semiconductor pattern, and
   hydrotreating the composite material layer, wherein the composite material layer contains titanium complex-graphene oxide, wherein
   the composite material layer contains $H_8F_6N_2Ti$-FGO (Functionalized Graphene Oxide); and
   the step of manufacturing the $H_8F_6N_2Ti$-FGO comprises:
   preparing graphene oxide by oxidation reaction using flake graphite as a raw material, and preparing graphene oxide ethanol solution based on the graphene oxide;
   adding carbamide into the graphene oxide ethanol solution to obtain carbamide-graphene oxide solution; and
   adding ionized water in which polyethylene glycol and ammonium fluorotitanate are dissolved into the carbamide-graphene oxide solution, and then performing post-treatment to obtain the $H_8F_6N_2Ti$-FGO.

2. The manufacturing method of the array substrate according to claim 1, wherein the semiconductor pattern contains polysilicon.

3. The manufacturing method of the array substrate according to claim 1, wherein the step of forming the composite material layer on the base substrate comprising the semiconductor pattern comprises:
   forming the composite material layer on the base substrate comprising the semiconductor pattern by spin coating.

4. The manufacturing method of the array substrate according to claim 1, wherein the step of preparing graphene oxide by oxidation reaction using flake graphite as a raw material comprises:
   by using natural flake graphite as a raw material and using potassium permanganate and concentrated sulfuric acid as an oxidant, placing the natural flake graphite and the oxidant into a reaction solvent to react for 1.5 hours.

5. The manufacturing method of the array substrate according to claim 1, wherein the step of forming the composite material layer on the base substrate comprising the semiconductor pattern comprises:
   by using an ethanol solution as a solvent, and ultrasonic dispersing the $H_8F_6N_2Ti$-FGO to prepare a spin-coated liquid containing $H_8F_6N_2Ti$-FGO; applying the spin-coated liquid evenly onto the base substrate of the semiconductor pattern and then drying.

6. The manufacturing method of the array substrate according to claim 1, further comprises etching and thus patterning the composite material layer.

7. An array substrate comprising a base substrate, a semiconductor pattern, a gate insulation layer, a gate electrode, an insulation layer and a source/drain electrode; wherein the array substrate further comprises:
   a composite material layer at least covering the semiconductor pattern, wherein the composite material layer contains titanium complex-graphene oxide containing hydrogen atoms,
   wherein the composite material layer contains $H_8F_6N_2Ti$-FGO (Functionalized Graphene Oxide) which is manufactured by:
   preparing graphene oxide by oxidation reaction using flake graphite as a raw material, and preparing graphene oxide ethanol solution based on the graphene oxide;
   adding carbamide into the graphene oxide ethanol solution to obtain carbamide-graphene oxide solution; and
   adding ionized water in which polyethylene glycol and ammonium fluorotitanate are dissolved into the carbamide-graphene oxide solution, and then performing post-treatment to obtain the $H_8F_6N_2Ti$-FGO.

8. The array substrate according to claim 7, wherein the semiconductor pattern contains polysilicon.

9. The array substrate according to claim 7, wherein the array substrate further comprises:
   a buffer layer disposed between the base substrate and the semiconductor pattern.

10. A display device comprising an array substrate, wherein the array substrate comprises a base substrate, a semiconductor pattern, a gate insulation layer, a gate electrode, an insulation layer and a source/drain electrode; wherein the array substrate further comprises:
    a composite material layer at least covering the semiconductor pattern, wherein the composite material layer contains titanium complex-graphene oxide containing hydrogen atoms,
    wherein the composite material layer contains $H_8F_6N_2Ti$-FGO (Functionalized Graphene Oxide) which is manufactured by:
    preparing graphene oxide by oxidation reaction using flake graphite as a raw material, and preparing graphene oxide ethanol solution based on the graphene oxide;
    adding carbamide into the graphene oxide ethanol solution to obtain carbamide-graphene oxide solution; and
    adding ionized water in which polyethylene glycol and ammonium fluorotitanate are dissolved into the carbamide-graphene oxide solution, and then performing post-treatment to obtain the $H_8F_6N_2Ti$-FGO.

* * * * *